(12) United States Patent
Straeussnigg et al.

(10) Patent No.: US 9,071,263 B2
(45) Date of Patent: Jun. 30, 2015

(54) MULTI-RATE PIPELINED ADC STRUCTURE

(71) Applicant: Infineon Technologies AG, Neubiberg (DE)

(72) Inventors: Dietmar Straeussnigg, Villach (AT); Andreas Wiesbauer, Poertschach (AT); Jose Luis Ceballos, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 14/085,577

(22) Filed: Nov. 20, 2013

(65) Prior Publication Data

US 2015/0138006 A1 May 21, 2015

(51) Int. Cl.
*H03M 1/06* (2006.01)
*H03M 1/12* (2006.01)

(52) U.S. Cl.
CPC ...................................... *H03M 1/12* (2013.01)

(58) Field of Classification Search
CPC ....... H03M 1/12; H03M 1/1009; H03M 1/00; H03M 1/0695; H03M 1/188; H03M 1/0863; H03M 1/1019; H03M 1/1028
USPC .......................... 341/118, 120, 155, 156, 161
See application file for complete search history.

(56) References Cited

U.S. PATENT DOCUMENTS

| | | | | |
|---|---|---|---|---|
| 6,084,539 A * | 7/2000 | Yamada | ......................... | 341/155 |
| 6,188,346 B1 * | 2/2001 | Waho et al. | .................... | 341/156 |
| 6,331,834 B1 * | 12/2001 | Smith | ............................ | 341/155 |
| 6,342,850 B1 * | 1/2002 | Borer et al. | ..................... | 341/156 |
| 6,396,429 B2 * | 5/2002 | Singer et al. | ................... | 341/155 |
| 6,825,789 B1 * | 11/2004 | Stewart et al. | .................. | 341/155 |
| 7,176,819 B1 * | 2/2007 | Swerlein et al. | ............... | 341/143 |
| 7,924,959 B2 * | 4/2011 | Jungerman et al. | ........... | 375/354 |
| 7,944,386 B2 * | 5/2011 | Hurrell et al. | ................. | 341/155 |
| 7,978,113 B2 * | 7/2011 | Kulchycki | ..................... | 341/155 |
| 8,009,072 B2 * | 8/2011 | Rigby et al. | ................... | 341/143 |
| 8,164,496 B2 * | 4/2012 | Velazquez | ..................... | 341/118 |
| 8,188,901 B1 * | 5/2012 | Inamdar et al. | ................ | 341/156 |
| 2002/0039077 A1 * | 4/2002 | Lyden | ........................... | 341/156 |
| 2005/0225468 A1 * | 10/2005 | Cosand | ......................... | 341/155 |
| 2007/0103355 A1 * | 5/2007 | Yamada | ......................... | 341/155 |
| 2010/0164767 A1 * | 7/2010 | Oshima et al. | ................ | 341/120 |
| 2012/0001783 A1 * | 1/2012 | Eklund et al. | ................. | 341/118 |
| 2012/0194371 A1 * | 8/2012 | Niwa et al. | ..................... | 341/143 |

OTHER PUBLICATIONS

A Cascaded Sigma—Delta Pipeline A/D Converter with 1.25 MHz Signal Bandwidth and 89 dB SNR; Brooks et al.; IEEE Journal of Solid-State Circuits, vol. 32, No. 12, Dec. 1997; pp. 1896-1906.

* cited by examiner

*Primary Examiner* — Linh Nguyen
(74) *Attorney, Agent, or Firm* — SpryIP, LLC

(57) ABSTRACT

Representative implementations of devices and techniques provide analog to digital conversion of analog inputs. A plurality of analog-to-digital converters (ADCs) can be arranged such that one or more of the ADCs is operating at a sampling rate that is less than others of the plurality of ADCs. For example, a sampling rate interpolator may be used to increase a sampling rate of signals output at the one or more ADCs operating at the lower sampling rate, allowing pipelining of the plurality of ADCs.

25 Claims, 6 Drawing Sheets

MULTI-RATE PIPELINED ADC STRUCTURE

BACKGROUND

Analog-to-digital converters (ADCs) convert analog input values to a digital form. For example, in many applications, it is desirable to digitally process signals that originate in an analog form. Such is generally the case with signals originating from various types of sensors and input devices. The signals may be converted to a digital approximation by an ADC and processed by control systems, processors, and the like. In such applications, it is also desirable for the ADC to exhibit high performance (e.g., signal-to-noise ratio, etc.) over the dynamic range (e.g., range of signal levels, etc.) of the sensor or input device.

In some cases, achieving a desired level of ADC performance over the dynamic range of a sensor within its application environment comes at the expense of significant overhead (e.g., area, power dissipation, etc.). Is such cases, a compromised solution may be used that has a lower performance or a limited range, to reduce the overhead. In other cases, it may not be feasible to cover the expected dynamic range at a desired level of performance.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Figure 1:
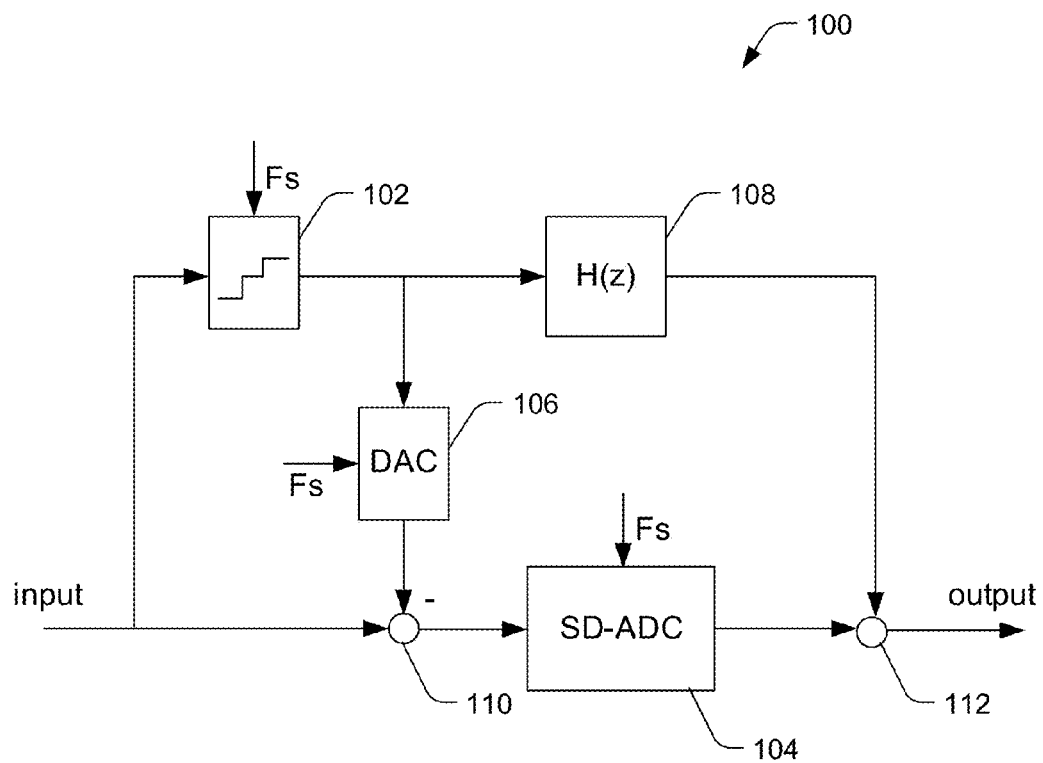
FIG. 1 is a block diagram of an example analog-to-digital converter (ADC) arrangement, wherein the techniques and devices disclosed herein may be applied.

In some applications, such as with sound pressure level sensors (e.g., microphones), or the like, it is desirable to capture very large signal levels (e.g., sound pressure levels up to 140 dB SPL, for example). In the applications, it is also desirable to convert these captured analog signals to a digital form for processing, with an optimum signal-to-noise ratio (SNR). In various implementations, analog-to-digital converter (ADC) structures can be arranged to maintain high SNR performance over a wide dynamic range of signal levels, with improved power efficiency.

Representative implementations of devices and techniques provide analog to digital conversion of analog inputs. In an implementation, an ADC structure is arranged such that different components of the ADC structure are operating at different clock frequencies or sampling rates. For example, in one implementation, a plurality of individual ADCs is coupled together and arranged such that one or more of the ADCs is operating at a sampling rate that is less than others of the plurality of ADCs, thereby reducing power consumption.

In one implementation, an ADC structure includes a first ADC operating at a first sampling rate coupled to a second ADC structure operating at a second, higher sampling rate. In the implementation, the ADC structure includes a sampling rate interpolator arranged to increase the sampling rate of the output signal of the first ADC, to form a modified output signal having the second, higher sampling rate. The ADC structure includes a combiner component arranged to combine the modified output signal (at the higher sampling rate) with the output signal of the second ADC, forming an output of the ADC structure. In an implementation, using the sampling rate interpolator allows the ADCs to be pipelined, and the outputs of multiple signal paths to be combined to form the output of the ADC structure.

In the implementation, portions of the ADC structure that can operate at a lower clock frequency or sampling rate, and achieve or maintain a desired level of performance, are arranged to operate at a lower clock frequency or sampling rate. In this way, less power is consumed by operating the components at the lower rates, than if they were operated at higher frequencies. In various implementations, alternate arrangements may be used to increase the quantity of ADC structure components operating at a lower clock frequency and further reduce power consumption while maintaining performance.

Various implementations and techniques for an analog to digital conversion arrangement are discussed in this disclosure. Techniques and devices are discussed with reference to example analog-to-digital converter (ADC) devices and systems illustrated in the figures. In some cases, flash ADC and sigma-delta ADC designs are shown and discussed. However, this is not intended to be limiting, and is for ease of discussion and illustrative convenience. The techniques and devices discussed may be applied to any of various ADC device designs, structures, and the like (e.g., successive-approximation ADC (SA-ADC), direct-conversion ADC, flash ADC, ramp-compare ADC, integrating ADC (also referred to as dual-slope or multi-slope ADC), counter-ramp ADC, pipeline ADC, sigma-delta ADC, time interleaved ADC, intermediate FM stage ADC, etc.), and remain within the scope of the disclosure.

Implementations are explained in more detail below using a plurality of examples. Although various implementations and examples are discussed here and below, further implementations and examples may be possible by combining the features and elements of individual implementations and examples.

Example ADC Arrangement

FIG. 1 is a block diagram of an example analog-to-digital converter (ADC) arrangement 100, wherein the techniques and devices disclosed herein may be applied. Analog signals ("analog input") are received on the input side, converted by a quantity of ADC components, and digital results ("digital output") are output from the ADC arrangement 100.

For the purposes of this disclosure, a digital result may be described as a digital approximation of an analog input. For example, a digital result may include a digital representation that is proportional to the magnitude of the voltage or current of the analog input, at a point in time and/or over a selected duration. The digital representation may be expressed in various ways (e.g., base 2 binary code, binary coded decimal, voltage values, electrical or light pulse attributes, and the like).

As shown in FIG. 1, an example ADC arrangement 100 may include a "first ADC" (or quantizer) 102, a "second ADC" 104, a digital-to-analog converter (DAC) 106, a digital filter component 108, and a pair of combiners 110, 112. In alternate implementations, an example ADC arrangement 100 may include fewer, additional, or alternate components, including additional stages of ADCs. As shown in FIG. 1, the ADCs may be arranged in a "pipeline" arrangement, where the output of one ADC (102 for example) may comprise at least a portion of an input of another ADC (104, for example).

In an implementation, the first ADC 102 receives an analog input (e.g., from a sensor, such as a microphone, for example) and determines a digital approximation for the analog input. In various implementations, the digital output of the first ADC 102 may have multiple bits, based on the resolution of the first ADC 102.

In an implementation, the second ADC 104 receives an analog input signal comprised of the analog input to the ADC arrangement 100 (from the sensor, for example) combined with an analog form of the output of the first ADC 102. The second ADC 104 converts the combined analog input signal to a digital approximation having a number of bits based on the resolution of the second ADC 104.

In an implementation, the DAC 106 receives the digital output of the first ADC 102, and converts it to an analog form (i.e., an analog output signal). As shown in FIG. 1, the analog form of the digital output is combined (e.g., subtracted) at combiner 110 with the analog input of the ADC arrangement 100. This combination becomes the analog input signal to the second ADC 104.

As shown in FIG. 1, an ADC arrangement 100 may have a single clock signal Fs distributed to each of the components (e.g., first ADC 102, second ADC 104, DAC 106, etc.), such that each of the components operates at the same frequency or sampling rate. In some cases, this may not be the most power efficient scenario, since the ADC arrangement 100 may be capable of performing equally well with some of the components operating at a lesser clock frequency or sampling rate.

As shown in FIG. 1, an ADC arrangement 100 may also include one or more digital filters 108. For example, a digital filter 108 may be arranged to filter the digital output of the first ADC 102, or the like. In an implementation, the output of the digital filter 108 and the output of the second ADC 104 are combined at combiner 112 to form the digital output signal of the ADC arrangement 100.

Example Multi-Rate ADC Structure

Figure 2:
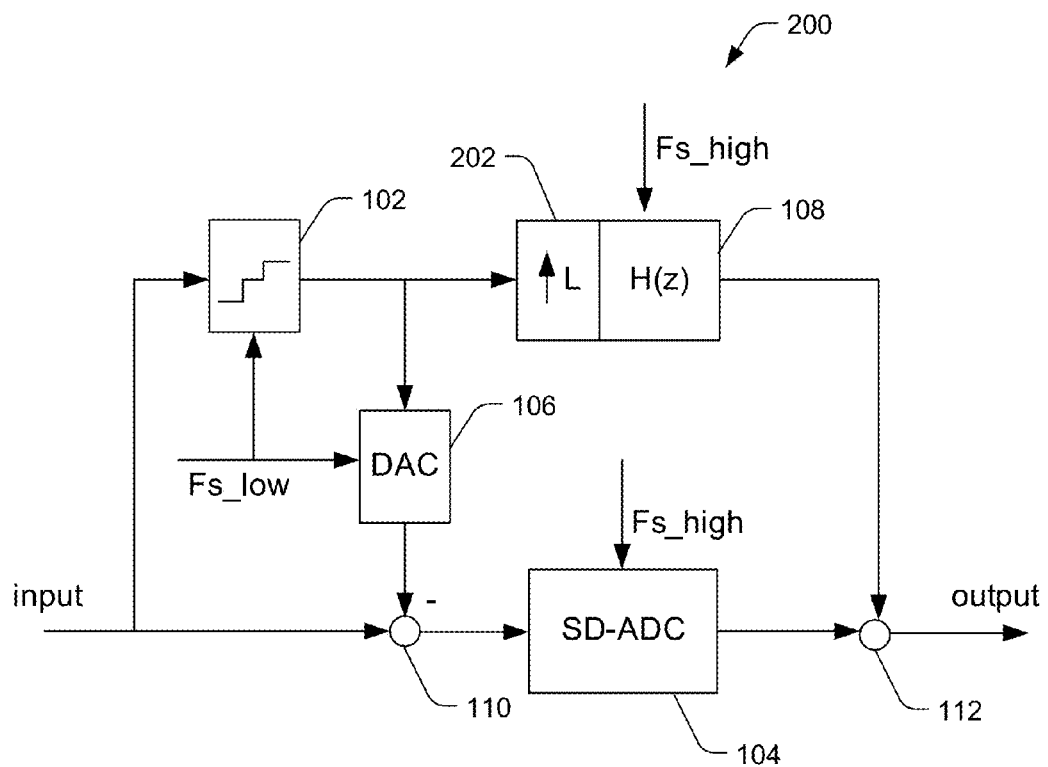
FIG. 2 is a block diagram of an example multi-rate analog-to-digital converter (ADC) structure, according to an implementation.

FIG. 2 is a block diagram of an example multi-rate analog-to-digital converter (ADC) structure 200, according to an implementation. As shown in FIG. 2, the example ADC structure 200 may include multiple signal paths (i.e., two or more digital signal paths), with each signal path including one or more ADCs (such as ADCs 102 and 104, for example). In various implementations, any number of ADCs (102, 104) may be employed, with corresponding digital signal paths. In some implementations, the ADCs are arranged in a pipeline arrangement, as shown in FIG. 2, and described above. In various implementations, the ADC structure 200 is arranged to receive an analog signal from the sound pressure capture device, for example, and to output a digital approximation of the analog signal, based on a combination of an output of the first signal path and an output of the second signal path.

As discussed above, the techniques, components, and devices described herein with respect to the example ADC structure 200 are not limited to the illustrations in FIGS. 2-5, and may be applied to other ADC structures, devices, and designs without departing from the scope of the disclosure. In some cases, additional or alternative components may be used to implement the techniques described herein. Further, the components may be arranged and/or combined in various combinations, while resulting in a digital output. It is to be understood that an ADC structure 200 may be implemented as a stand-alone device or as part of another system (e.g., integrated with other components, systems, etc.).

As shown in FIG. 2, an example ADC structure 200 may include first 102 and second 104 ADCs. In the example, the first ADC 102 is arranged to receive an analog input (e.g., from a sensor, such as a microphone, for example) and determine a digital approximation for the analog input. The second ADC 104 is arranged to receive an analog input signal comprised of the analog input to the ADC structure 200 (from the sensor, for example) combined with an analog form of the output of the first ADC 102. However, in an implementation, the first ADC 102 and the second ADC 104 are operating at different sampling rates. As shown in FIG. 2, the first ADC 102 is operating at a first sampling rate (e.g., Fs_low) and the second ADC 104 is operating at a second sampling rate (Fs_high) that has a higher frequency than the frequency of the first sampling rate.

In one example, the first ADC 102 comprises a flash ADC, or the like, and the second ADC 104 comprises a sigma-delta ADC, or the like. While it is desirable for the sigma-delta-type second ADC 104 to operate at a higher sampling rate (e.g., oversampling) for optimal performance, it may not improve the performance of the flash-type first ADC 102 to operate at the higher sampling rate. In fact, it may be optimal for the first ADC 102 to operate at a much lower sampling rate (e.g., hundreds or thousands times lower, for instance, based on the technologies used for the ADCs 102, 104) than that of the second ADC 104. Further, in various implementations, power savings can be realized without negatively impacting the performance of the ADC structure 200 by operating the first ADC at the lower sampling rate (Fs_low) instead of the higher sampling rate (Fs_high).

For example, in an implementation, the first ADC 102 and the second ADC 104 may be coordinated for optimal performance of the ADC structure 200 over a wide dynamic range. In the implementation, the first signal path (including the first ADC 102) is arranged to provide a coarse-resolution analog-to-digital conversion for received sound pressure levels at or above a predetermined threshold (110 dB SPL, for example) and the second signal path (including the second ADC 104) is arranged to provide a fine-resolution analog-to-digital conversion for received sound pressure levels below the predetermined threshold. This coordinated arrangement can provide for a combined increased dynamic range of input levels.

Accordingly, the ADC structure 200 may be arranged for a staged operation, to cover a wide dynamic range, where the second signal path (including the second ADC 104) is arranged to activate when the ADC structure 200 receives an analog signal from the sound pressure capture device, for example, and the first signal path (including the first ADC 102) is arranged to activate (resulting in the entire ADC structure 200 being active) when the analog signal received from the sound pressure capture device indicates a sound pressure level at or above the predetermined threshold. In various implementations, the predetermined threshold may be user-determined, manufacturer-determined, design-determined, and/or based on the ADCs and other components selected for implementing the ADC structure 200.

As discussed above, in various implementations, the output of the ADC structure 200 comprises a combination of a form of the output of the first ADC 102 and the output of the second ADC 104 (performed at combiner 112). In one implementation, the ADC structure 200 includes a sampling rate interpolator 202 arranged to increase a sampling rate of the output signal of the first ADC 102 to form a modified output signal having the second, higher sampling rate. For example, combiner 112 is arranged to combine the modified output signal and the output signal of the second ADC 104 to form the output signal of the ADC structure 200.

In alternate implementations, the interpolator 202 comprises an interpolation component, upsampling component (such as a device, circuit, module, etc.), or like element, that is arranged to match (i.e., increase) the sampling rate of the output of the first ADC 102 to the sampling rate of the output of the second ADC 104, so that they may be combined at the combiner 112 to form the output of the ADC structure 200. In various implementations, the interpolator 202 may comprise one element or a plurality of elements arranged to match (i.e., increase) the sampling rate of the output of the first ADC 102 to the sampling rate of the output of the second ADC 104.

In an implementation, the ADC structure 200 includes a digital filter component 108, operating at a frequency of the second, higher sampling rate (Fs_high), as shown in FIG. 2. In one implementation, the digital filter component 108 follows the interpolation component 202 and is arranged to filter the modified output signal. In the implementation, the modified output signal is filtered by the filter 108 prior to combining with the output of the second ADC 104 to form the output of the ADC structure 200. For example, the digital filter component 108 may be arranged to reduce distortion in the first signal path and/or the second signal path, resulting from increasing the sampling rate of the first signal path to the second sampling rate (Fs_high).

As shown in FIG. 2, in an implementation, the ADC structure 200 includes a digital-to-analog converter (DAC) 106 arranged to convert the output signal of the first ADC 102 to an analog output signal. As shown in FIG. 2, the DAC 106 may operate at a frequency of the first sampling rate (Fs_low), thereby conserving energy. In an implementation, the ADC structure 200 includes a combiner 110 (e.g., adder/subtracter) arranged to combine (e.g., subtract) the analog output signal of the DAC 106 with the input signal of the ADC structure 200 to form the input signal of the second ADC 104.

In one implementation, the digital filter component 108 is arranged to compensate for switching transients formed by the second ADC 104 based on the analog output signal of the DAC 106, which forms at least a portion of the input to the second ADC 104. For example, the second ADC 104 may produce high-frequency switching transients (for example, when the second ADC 104 comprises a sigma-delta ADC) based on the analog form of the digital output of the first ADC 102.

Figure 5:
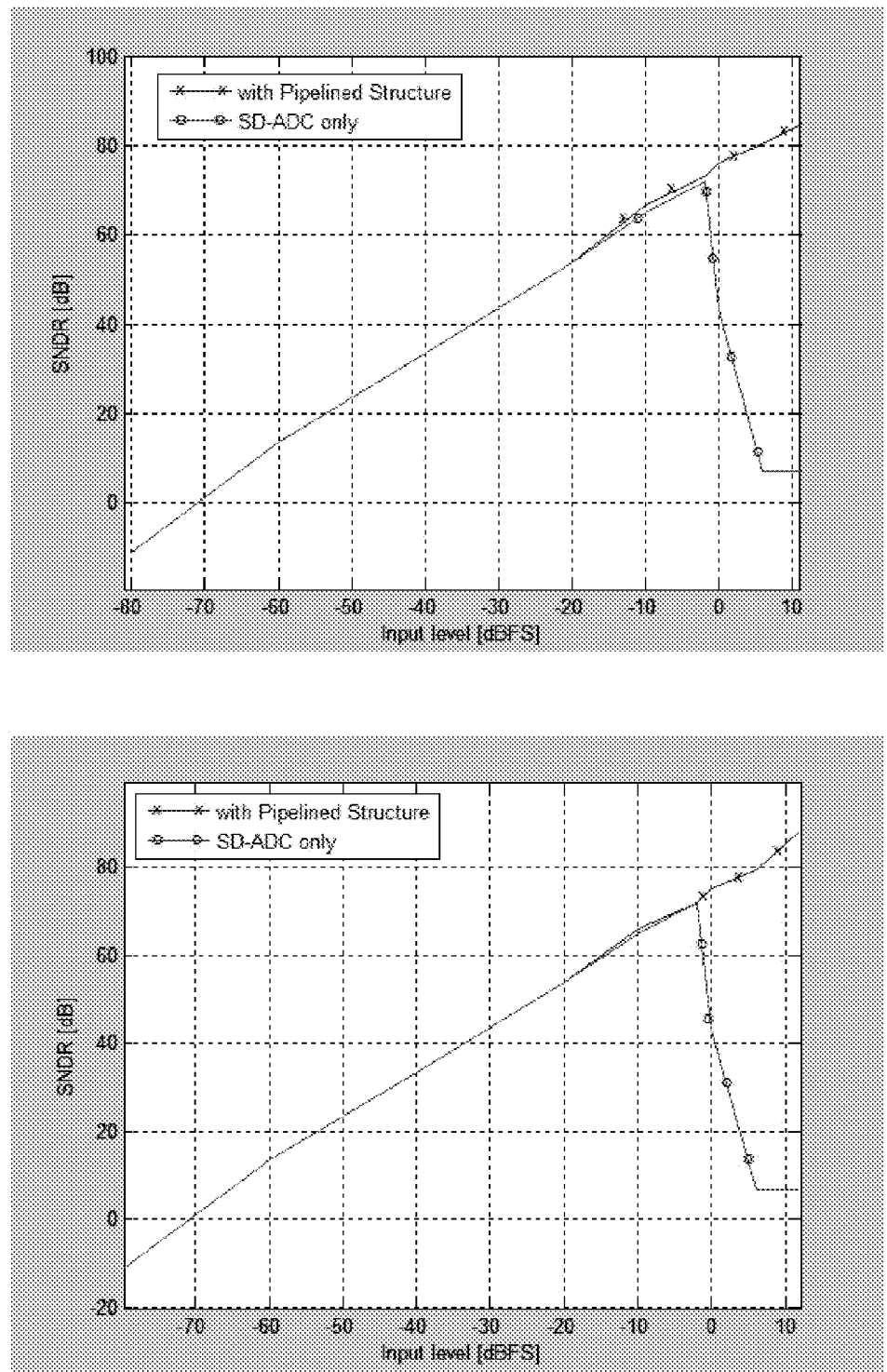
FIG. 5 shows two performance diagrams illustrating the use of multi-rate ADC structures, according to two implementations.

Referring to FIG. 5, the upper graph shows a representative performance of a single sigma-delta ADC, indicated by the lines indicated by "o," and the representative performance of an ADC structure 200 including at least two digital signal paths as described above, indicated by the lines indicated by "x." As shown in the upper graph of FIG. 5, the "pipelined" ADC structure 200 with ADCs operating at different sampling rates provides a nearly linear response of increasing signal-to-noise ratio performance (SNDR) over a greater dynamic range of input levels than the performance of the sigma-delta ADC alone (which drops off at about −3 dB).

Figure 3:
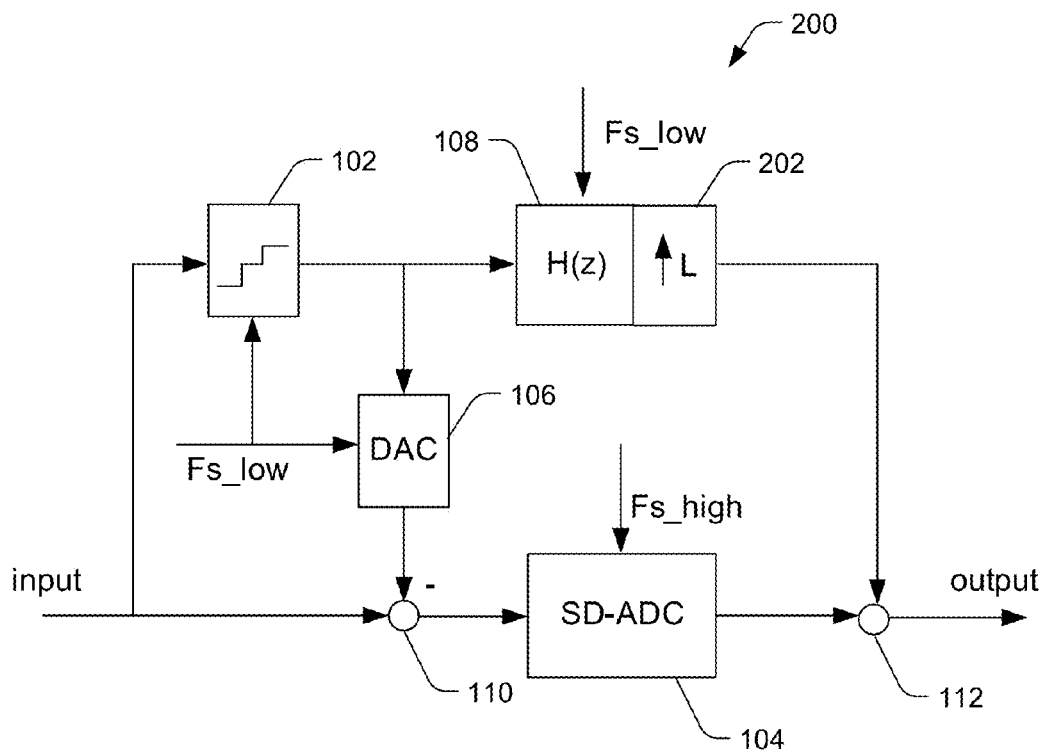
FIG. 3 is a block diagram of an example multi-rate analog-to-digital converter (ADC) structure, according to another implementation.

Referring to FIG. 3, in an implementation, the ADC structure 200 may be arranged such that the digital filter component is operating at a frequency of the first sampling rate (Fs_low), thereby conserving additional energy. For example, in the implementation, the digital filter component 108 precedes the interpolation component 202 in the first signal path. In an implementation, as shown in FIG. 3, the digital filter component 108 is arranged to filter the output signal of the first ADC 102 and to feed the filtered output signal to the sampling rate interpolator 202. As discussed above, the interpolator 202 is arranged to increase the sampling rate of the filtered output signal of the first ADC 102 to form a modified output signal having the second, higher sampling rate (Fs_high). The modified output signal is combined (at combiner 112) with the output of the second ADC 104 to form the output of the ADC structure 200.

Figure 4:
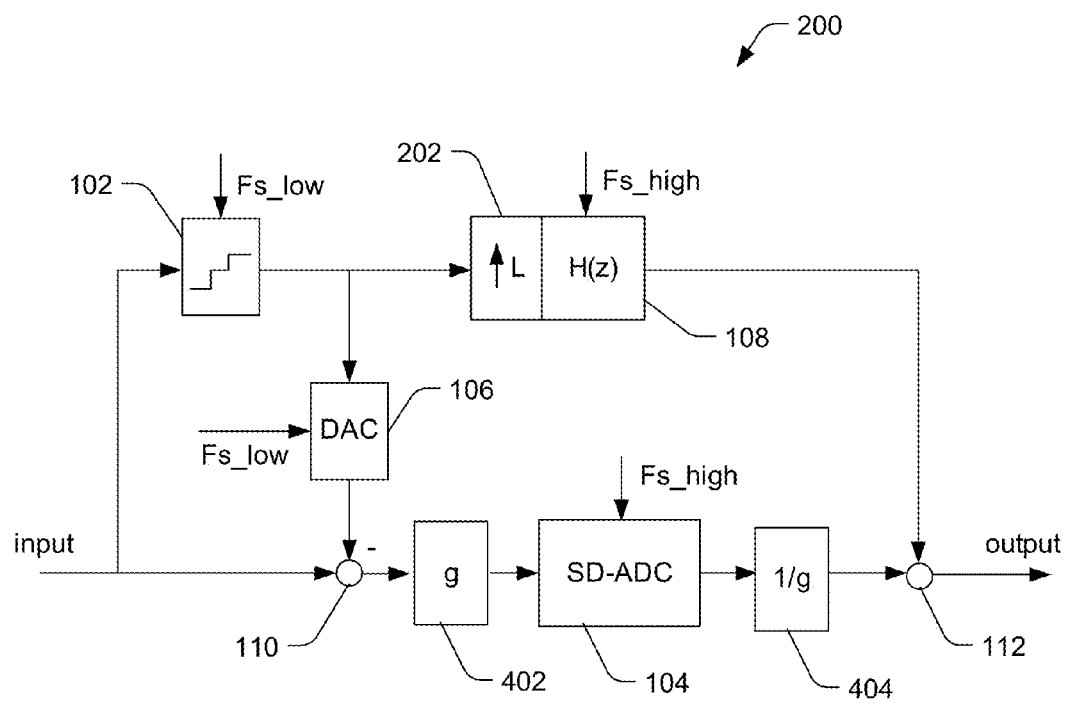
FIG. 4 is a block diagram of an example multi-rate analog-to-digital converter (ADC) structure, including gain components, according to an implementation.

Referring to FIG. 4, in an implementation, the performance of the ADC structure 200 may be improved (e.g., improved signal-to-noise ratio (SNR), etc.) for a given dynamic range (or the dynamic range may be increased, for example) with the addition of one or more gain components (e.g., scaling components) 402 and 404. For example, using either configuration of ADC structure 200 from FIG. 2 or from FIG. 3 (as well as alternate configurations), a first gain block 402 may be arranged prior to the second ADC 104 and a second gain block 404 may be arranged after the second ADC 104 in the second signal path. In an implementation, the gain components 402, 404 are arranged to increase the gain of the signal prior to processing the signal by the second ADC 104 and to decrease the gain of the resulting output signal of the second ADC 104.

For example, the first gain block 402 is arranged to receive the combination analog input signal from the combiner 110 and increase a gain (i.e., magnitude, amplitude, etc.) of the analog signal by a factor (e.g., multiplier) "g." In various implementations, the factor g may be user-defined and/or user-adjustable. In other implementations, the factor g may be "factory-set," or the like, for optimal performance. In the example, the gain-enhanced analog signal is received by the second ADC 104 and converted to a digital approximation.

The digital output of the second ADC 104 is received by the second gain block 404. In the example, the block 404 is arranged to reduce the gain of the digital signal by a factor "1/g" (e.g., the inverse of the factor g), returning the signal to a "nominal" level, for instance. In an alternate implementation, the block 404 is arranged to change the gain by another factor, to accommodate a circuit at the output of the ADC arrangement 200, or the like. In an implementation, boosting the gain of the second signal path during processing by the second ADC 104 improves the accuracy of the digital approximation output by the second ADC 104, and the like.

Referring again to FIG. 5, the lower graph shows a representative performance of a single sigma-delta ADC, indicated by the lines indicated by "o," and, the representative performance of an ADC structure 200 including one or more gain blocks (402, 404) is indicated by the lines indicated by "x." As shown in the lower graph of FIG. 5, the "pipelined" ADC structure 200 with gain blocks (402, 404) provides a nearly linear response of increasing signal-to-noise ratio performance (SNDR) over a greater dynamic range of input levels than the performance of the sigma-delta ADC alone (which drops off at about −3 dB).

In alternate implementations, gain components (such as gain components 402, 404, for example) may be used in either or both of the first and second signal paths (or other signal paths, if present). For instance, one or more gain components (e.g., 402, 404) may be arranged to increase the gain of the input signal of the first ACD 102 and/or of the second ADC, and to decrease the gain of the output signal of the at the first ADC 102 and of the second ADC 104, while the first ADC 102 operates at one sampling rate (Fs_low, for example) and the second ADC 104 operates at another sampling rate (Fs_high, for example).

In various implementations, additional or alternative components may be used to accomplish the disclosed techniques and arrangements.

Representative Process

Figure 6:
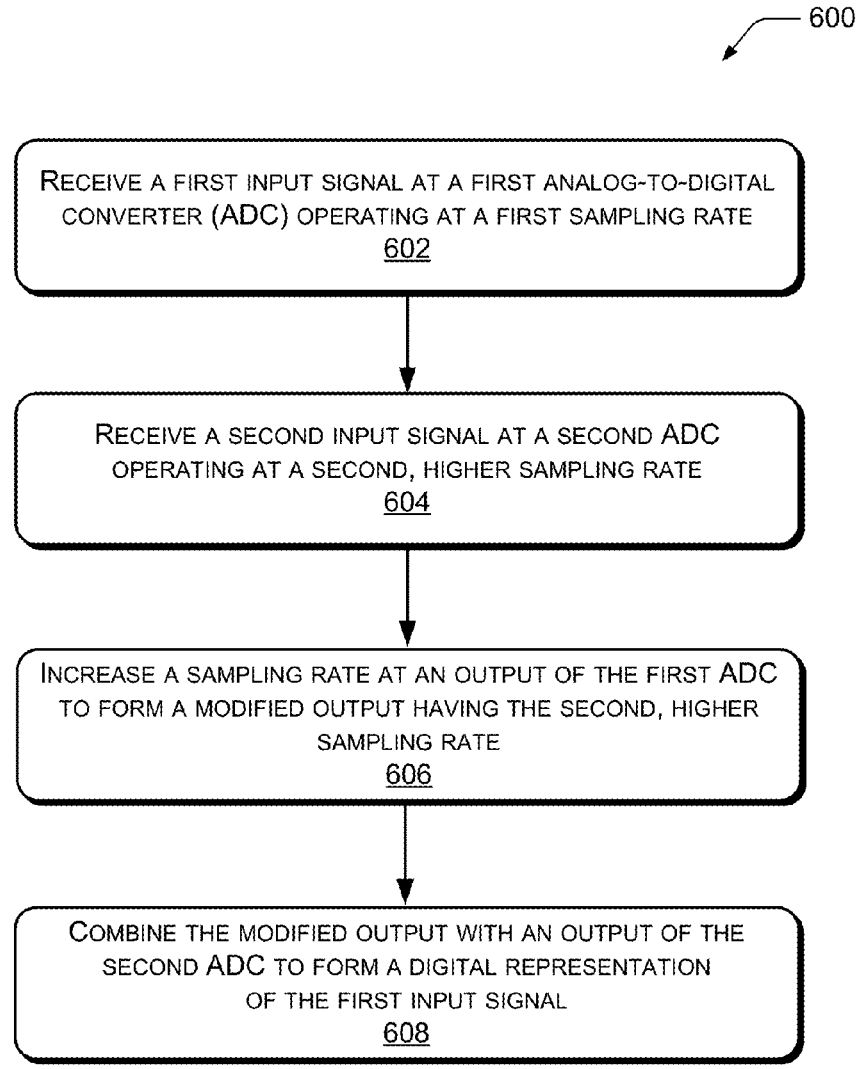
FIG. 6 is a flow diagram illustrating an example process for providing analog to digital conversion with a multi-rate ADC structure, according to an implementation.

FIG. 6 is a flow diagram illustrating an example process 600 for providing analog to digital conversion of analog inputs, according to an implementation. The process 600 describes using a multi-rate ADC structure (such as ADC structure 200, for example) to provide analog-to-digital conversion for a wide range of input levels, while maintaining a high signal-to-noise ratio. For example, the ADC structure may use multiple ADCs in a pipelined arrangement, where the input of one ADC stage comprises at least a portion of an output of another ADC stage. In various implementations, the multiple ADCs operate at different sampling rates. The process 600 is described with reference to FIGS. 1-5.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

In an implementation, the multi-rate ADC structure includes two or more digital signal paths. At block 602, the process includes receiving a first input signal at a first analog-to-digital converter (ADC) (such as ADC 102, for example) operating at a first sampling rate (such as Fs_low, for example). In an implementation, the first ADC is part of a first signal path. In an example, the first input signal comprises an input to the ADC structure 200.

At block 604, the process includes receiving a second input signal at a second ADC (such as ADC 104, for example) operating at a second, higher sampling rate (such as Fs_high, for example). In an implementation, the second ADC is part of a second signal path.

In an example, the second input signal comprises a combination of a form of the output of the first ADC and the input to the ADC structure 200. For instance, in an implementation, the process includes converting a digital output signal of the first ADC to form an analog signal and combining the analog signal with the first input signal to form an input of the second ADC. In an implementation, the process includes converting the digital output signal of the first ADC to form an analog signal via a digital-to-analog converter (DAC) operating at a frequency of the first sampling rate.

At block 606, the process includes increasing a sampling rate at an output of the first ADC to form a modified output having the second, higher sampling rate. For example, in an implementation, the process includes using a sampling rate interpolator arrangement to increase the sampling rate of the output of the first ADC. In an implementation, increasing the sampling rate of the output of the first ADC allows the output of the first ADC to be combined with the output of the second ADC, to form the output of the ADC structure.

In an implementation, the process includes digitally filtering the output of the first ADC at a frequency of the first sampling rate prior to increasing the sampling rate at the output of the first ADC.

In another implementation, the process includes digitally filtering the modified output (e.g., the upsampled output of the first ADC) at a frequency of the second sampling rate, to compensate for switching transients formed by the second ADC based on the analog signal. For example, the second ADC may produce transients based on receiving the analog form of the output of the first ADC.

At block 608, the process includes combining the modified (e.g., upsampled) output from the first ADC with the output of the second ADC to form a digital representation of the first input signal (i.e., the input to the ADC structure). In an implementation, the two signals are combined at a combiner component (such as combiner 112, for example).

In one implementation, the process includes improving analog-to-digital conversion performance (e.g., SNR performance) over a desired dynamic range by increasing a gain of an input signal of the first ADC and/or the second ADC, processing the gain-increased input signal with the first ADC and/or the second ADC, and decreasing a gain of an output signal of the first ADC and/or the second ADC. In the implementation, the gain-increased signal allows for a more accurate digital approximation of the input signal.

In another implementation, the process includes improving power efficiency over a desired dynamic range using a plurality of coupled ADCs to provide analog-to-digital conversion. For example, the ADC structure may use two or more ADCs, each having associated signal paths, to provide the analog-to-digital conversion. In the implementation, one or more ADCs of the plurality of coupled ADCs operates at a lower sampling rate than other ADCs of the plurality of coupled ADCs.

In an implementation, the process includes providing analog-to-digital conversion over a preselected dynamic range by arranging the plurality of coupled ADCs in a pipeline arrangement. In various implementations, the process includes outputting a digital output value from the ADC structure based on the combined conversions of each ADC of the plurality of coupled ADCs.

In alternate implementations, other techniques may be included in the process 600 in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:
1. An apparatus, comprising:
a first analog-to-digital converter (ADC) operating at a first sampling rate;
a second ADC operating at a second, higher sampling rate;

a sampling rate interpolator arranged to increase a sampling rate of an output signal of the first ADC to form a modified output signal having the second, higher sampling rate;

a digital filter component arranged to filter the modified output signal;

a digital-to-analog converter (DAC) arranged to convert the output signal of the first ADC to an analog output signal, the digital filter component arranged to compensate for switching transients formed by the second ADC based on the analog output signal of the DAC; and a combiner arranged to combine the modified output signal and an output signal of the second ADC to form an output signal of the apparatus.

2. The apparatus of claim 1, wherein the digital filter component operates at a frequency of the second, higher sampling rate.

3. The apparatus of claim 1, wherein the DAC operates at a frequency of the first sampling rate.

4. The apparatus of claim 1, further comprising another combiner arranged to combine the analog output signal of the DAC with an analog input of the apparatus to form an analog input signal of the second ADC.

5. The apparatus of claim 1, further comprising a digital filter component operating at a frequency of the first sampling rate and arranged to filter the output signal of the first ADC and to feed the filtered output signal to the sampling rate interpolator.

6. The apparatus of claim 1, further comprising one or more scaling components arranged to increase a gain of an input signal of at least one of the first ADC and the second ADC, and to decrease a gain of an output signal of the at the at least one of the first ADC and the second ADC.

7. The apparatus of claim 1, wherein the first ADC comprises a flash ADC.

8. The apparatus of claim 1, wherein the second ADC comprises a sigma-delta ADC.

9. A system, comprising:

a sound pressure capture device; and an analog-to-digital conversion (ADC) structure, including:

a first signal path including a first ADC component operating at a first sampling rate; and a second signal path including a second ADC component operating at a second sampling rate, the second sampling rate having a higher frequency than the first sampling rate, the ADC structure arranged to receive an analog signal from the sound pressure capture device and to output a digital approximation of the analog signal, based on a combination of an output of the first signal path and an output of the second signal path, and wherein the first signal path is arranged to provide a coarse-resolution analog-to-digital conversion for received sound pressure levels at or above a predetermined threshold and the second signal path is arranged to provide a fine-resolution analog-to-digital conversion for received sound pressure levels below the predetermined threshold.

10. The system of claim 9, further comprising an interpolation component arranged to increase a sampling rate at the output of the first signal path to the second, higher sampling rate.

11. The system of claim 10, further comprising a digital filter component arranged to reduce distortion in the first signal path and/or the second signal path, resulting from increasing the sampling rate of the first signal path to the second sampling rate.

12. The system of claim 11, wherein the digital filter component follows the interpolation component and operates at a frequency of the second sampling rate.

13. The system of claim 11, wherein the digital filter component precedes the interpolation component and operates at a frequency of the first sampling rate.

14. The system of claim 9, further comprising a digital-to-analog converter (DAC) arranged to convert a digital signal output at the first ADC to an analog input signal received at the second ADC, the DAC operating at a frequency of the first sampling rate.

15. The system of claim 9, further comprising one or more components of the second signal path arranged to increase a gain of a signal prior to processing of the signal by the second ADC and to decrease a gain of a resulting output signal of the second ADC.

16. The system of claim 9, wherein the ADC structure is arranged for a staged operation, the second signal path activating when the ADC structure receives an analog signal from the sound pressure capture device and the first signal path activating when the analog signal received from the sound pressure capture device indicates a sound pressure level at or above the predetermined threshold.

17. A method, comprising:

receiving a first input signal at a first analog-to-digital converter (ADC) operating at a first sampling rate;

receiving a second input signal at a second ADC operating at a second, higher sampling rate;

increasing a sampling rate at an output of the first ADC to form a modified output having the second, higher sampling rate;

converting the output of the first ADC to an analog output signal;

compensating for switching transients formed by the second ADC based on the analog output signal; and combining the modified output with an output of the second ADC to form a digital representation of the first input signal.

18. The method of claim 17, further comprising digitally filtering the output of the first ADC at a frequency of the first sampling rate prior to increasing the sampling rate at the output of the first ADC.

19. The method of claim 17, further comprising converting a digital output signal of the first ADC to form an analog signal and combining the analog signal with the first input signal to form an input of the second ADC.

20. The method of claim 19, further comprising converting the digital output signal of the first ADC to form an analog signal via a digital-to-analog converter (DAC) operating at a frequency of the first sampling rate.

21. The method of claim 19, further comprising digitally filtering the modified output at a frequency of the second sampling rate, to compensate for switching transients formed by the second ADC based on the analog signal.

22. The method of claim 17, further comprising improving conversion performance over a desired dynamic range by increasing a gain of an input signal of the first ADC and/or the second ADC, processing the gain increased input signal with the first ADC and/or the second ADC, and decreasing a gain of an output signal of the first ADC and/or the second ADC.

23. The method of claim 17, further comprising improving power efficiency over a desired dynamic range using a plurality of coupled ADCs to provide analog-to-digital conversion, wherein one or more ADCs of the plurality of coupled ADCs operates at a lower sampling rate than other ADCs of the plurality of coupled ADCs.

24. The method of claim 23, further comprising providing analog-to-digital conversion over a preselected dynamic range by arranging the plurality of coupled ADCs in a pipeline arrangement.

25. The system of claim 9, further comprising a digital filter component arranged to compensate for switching transients formed by the second ADC.

* * * * *